United States Patent
Ge et al.

(10) Patent No.: US 10,310,013 B2
(45) Date of Patent: Jun. 4, 2019

(54) TEST MODE ISOLATION AND POWER REDUCTION IN EMBEDDED CORE-BASED DIGITAL SYSTEMS OF INTEGRATED CIRCUITS (ICS) WITH MULTIPLE POWER DOMAINS

(71) Applicant: Samsung Electronics Co., Ltd., Suwon-si, Gyeonggi-do (KR)

(72) Inventors: Guangyuan Kelvin Ge, Cedar Park, TX (US); Rajesh Kashyap, Austin, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 89 days.

(21) Appl. No.: 15/470,880

(22) Filed: Mar. 27, 2017

(65) Prior Publication Data
US 2018/0164376 A1    Jun. 14, 2018

Related U.S. Application Data

(60) Provisional application No. 62/433,235, filed on Dec. 12, 2016.

(51) Int. Cl.
*G01R 31/28* (2006.01)
*G01R 31/317* (2006.01)
*G01R 31/3185* (2006.01)

(52) U.S. Cl.
CPC . *G01R 31/31721* (2013.01); *G01R 31/31701* (2013.01); *G01R 31/318508* (2013.01); *G01R 31/31723* (2013.01)

(58) Field of Classification Search
CPC .......... G01R 31/31721; G01R 31/3177; G01R 31/31723; G01R 31/31701; G01R 31/31705
See application file for complete search history.

(56) References Cited

U.S. PATENT DOCUMENTS 8,225,154 B2    7/2012  Sanavage et al.
8,531,204 B2    9/2013  Meijer et al.
(Continued)

FOREIGN PATENT DOCUMENTS

KR    20030040511 A    5/2003

OTHER PUBLICATIONS

Chickermane, Vivek et al., "A Power-Aware Test Methodology for Multi-Supply Multi-Voltage Designs", 2008 IEEE International Test Conference, Paper 9.1, Jan. 1, 2008, 10 pages.
(Continued)

*Primary Examiner* — Thien Nguyen
(74) *Attorney, Agent, or Firm* — Renaissance IP Law Group LLP

(57) ABSTRACT

Embodiments include a power isolation circuit. The power isolation circuit includes a logic block, a wrapper cell, an isolation cell, a test control unit, and/or a power control unit. The power control unit is coupled to the isolation cell and configured to receive a DFT internal core test mode control signal and a clamp control signal, and control the isolation cell dependent on the DFT internal core test mode control signal and the clamp control signal. Also disclosed is a multi-power domain multi-power isolation system, which includes a first power domain and a second power domain. The first power domain includes a logic block, wrapper cells, isolation cells, and a power control unit. The second power domain includes a logic block, wrapper cells, and level-shifter cells. The power control unit is coupled to the isolation cells. Additional power domains with similar characteristics can be included in the design.

20 Claims, 12 Drawing Sheets

(56) References Cited

U.S. PATENT DOCUMENTS

2011/0221502 A1* 9/2011 Meijer ........... G01R 31/318508
327/333
2013/0305207 A1* 11/2013 Hsieh .................. G06F 17/5009
716/136
2015/0303900 A1* 10/2015 Wang ................... H03K 3/0375
327/198

OTHER PUBLICATIONS

Lin, Xijiang, "Low Power Testing—What Can Commercial Design-for-Test Tools Provide?", Journal of Low Power Electronics and Applications, Dec. 9, 2011, pp. 357-372.

* cited by examiner

TEST MODE ISOLATION AND POWER REDUCTION IN EMBEDDED CORE-BASED DIGITAL SYSTEMS OF INTEGRATED CIRCUITS (ICS) WITH MULTIPLE POWER DOMAINS

RELATED APPLICATION DATA

This application claims the benefit of U.S. Provisional Patent Application Ser. No. 62/433,235, filed on Dec. 12, 2016, which is hereby incorporated by reference.

FIELD

The present disclosure relates to digital integrated circuits (ICs), and more particularly, to a system and method for test mode isolation and power reduction in embedded core-based digital systems of ICs with multiple power domains.

BACKGROUND

In a large digital integrated circuit (IC) design, such as a large system-on-chip (SOC), there can be multiple embedded cores or hard intellectual properties (IPs). Due to the large design size and complexity of the functional IP types, the design is mostly partitioned into multiple physical partitions. For test and debugging purposes, the design is further divided into multiple designs for testing (DFT) partitions, which are often based on the functional and physical design partitions. Each of the embedded cores and hard IPs are often treated as separate partitions with some small IPs grouped into a bigger physical partition.

The physical partition approach, and similarly hierarchical design approach, is intended to better optimize the design for area and performance including timing/speed and low power. In a typical low-power high-performance SOC, there are also multiple power domains of which some of the embedded cores or hard IPs have separate power domains. The power for each embedded core may be separately switched on/off as required to achieve a low power goal and higher performance without encountering power or thermal issues in the chip. With multi-power domains in the design, there are often power management and power isolation circuits among the different power domains in the SOC.

In such physical partitions, mostly the embedded cores, often the DFT test wrapper cells are inserted around the input/outputs (I/Os) of the partition to isolate the cores during a test mode. The test wrapper cells provide controllability to the inputs, and added observability to the outputs in an internal core test (INTEST) mode, and vice versa in an external test (EXTEST) mode. So, on a common core, there may be power isolation cells in addition to test wrapper cells on the I/O paths since the core could have its own power domain and its own DFT partition. This leads to large delays to the I/O paths, an increase in circuit area, and an increase in power consumption.

Therefore, optimizing a core I/O structure is crucial to improving chip performance in both test and functional modes such as I/O paths, in particular critical I/O paths, optimizing for timing/speed, reducing logic and area overhead, as well as lowering power consumption.

The importance of a scan design in the overall physical implementation flow can be evidenced in all areas of the design. There have been numerous efforts in improving scan design from the scan insertion to the scan chain reordering and optimization in physical placement. In a typical low-power design with multiple power domains, power related cells, such as a power isolation cell, a level shifter, and a power gating cell, may be inserted on the I/Os of a core and IPs at the block boundary for low-power operations.

A typical method for test wrapper cell insertion for test purposes and power cell insertion for power isolation and low-power operations at the block boundary on I/O paths needs to provide a test operation and a low-power operation separately. Since the test wrapper cells and power cells are inserted to the same I/O paths in the design, this creates additional physical design and performance problems that have to be addressed during physical design process. Such problems include a highly congested I/O boundary with both the test wrapper and power cells and their associated logics. The I/O paths, in particular, some critical I/O paths, may experience speed and timing problems. Increased logic and area overhead for such logic and cells also present challenges. Other problems arise as well such as an increase in power consumption for such cells that contribute to an increase in overall chip power consumption.

SUMMARY

Embodiments may include a power isolation circuit and method for testing thereof. The power isolation circuit may include a logic block, a wrapper cell coupled to the logic block, and an isolation cell coupled to the wrapper cell. The power isolation circuit may further include a power control unit coupled to the isolation cell. The power control unit may be configured to receive a DFT internal core test mode control signal and a clamp control signal, and to control the isolation cell dependent on the DFT internal core test mode control signal and the clamp control signal.

Embodiments include a multi-power domain multi-power isolation system, which includes a first power domain comprising a first logic block, a first plurality of wrapper cells coupled to the first logic block, a plurality of isolation cells, and a power control unit. The multi-power domain multi-power isolation system may further include a second power domain comprising a second logic block, a second plurality of wrapper cells coupled to the second logic block, and a plurality of level-shifter cells. In some embodiments, each isolation cell from among the plurality of isolation cells is coupled to a corresponding wrapper cell from among the first plurality of wrapper cells. In some embodiments, each level-shifter cell from among the plurality of level-shifter cells is coupled to a corresponding wrapper cell from among the second plurality of wrapper cells. In some embodiments, an output terminal of each isolation cell from among the plurality of isolation cells is coupled to an input terminal of each level-shifter cell from among the plurality of level-shifter cells. In some embodiments, the power control unit is coupled to the plurality of isolation cells in the first power domain.

BRIEF DESCRIPTION OF THE DRAWINGS

The foregoing and additional features and advantages of the present inventive principles will become more readily apparent from the following detailed description, made with reference to the accompanying figures, in which.

DETAILED DESCRIPTION

Figure 1A:
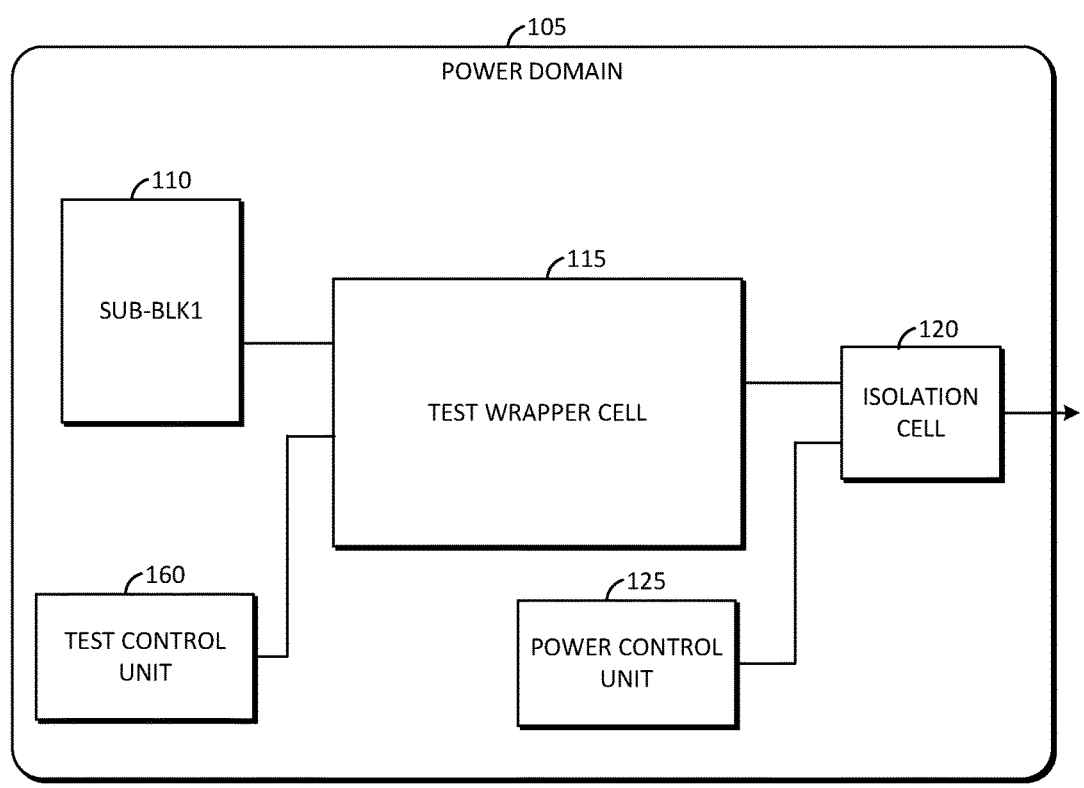
FIG. 1A is an example block diagram of a power domain and related power isolation circuits including a logic block, a wrapper cell, an isolation cell, and a power control unit, in accordance with some embodiments.

Reference will now be made in detail to various embodiments, examples of which are illustrated in the accompanying drawings. In the following detailed description, numerous specific details are set forth to enable a thorough understanding of the embodiments. It should be understood, however, that persons having ordinary skill in the art may practice the embodiments without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first power isolation cell could be termed a second power isolation cell, and, similarly, a second power isolation cell could be termed a first power isolation cell, without departing from the scope of the embodiments.

The terminology used in the description of the embodiments herein is for the purpose of describing particular embodiments only and is not intended to be limiting of the embodiments. As used in the description of the embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

The present disclosure is related to a low-power high-performance circuit design with embedded cores and multiple power domains. In particular, the present system and method reduces overall logic on the input/output (I/O) paths without losing the functionality for test and power isolation. The present system and method provides both power and test isolation functions with reduced overhead on logic and area, improved timing and speed on the I/O paths, and lower power consumption. The present system and method shares and combines test wrapper cells and power isolation logic and cells to a low-power SOC design to achieve high performance. Advantages over conventional approaches may be realized, including minimizing the impact and increasing the optimization on critical I/O paths to satisfy timing targets, while reducing area and power, and simplifying the I/O structure in the design.

The present disclosure relates to the testing and design of large digital ICs with multiple embedded cores and IPs of multiple power domains in a low-power chip design, such as mobile central processing units (CPUs) and SOCs. In particular, the present system and method provides test wrapper cell and low-power cell insertion and optimization at the I/O paths of embedded cores in design with multiple power domains.

In a multiple power domain design, different cores or IP blocks can be in different power domains. To ensure the proper operations of the ICs in different modes, the cores or IP blocks have test isolation functionality in a test mode during a core or block under test, and have power isolation functionality for low power mode during power ON/OFF of the associated power domain. The test isolation can be implemented through test wrapper cell logic. The power isolation can be implemented through power isolation (CLAMP) cell logic. In conventional methods, the test isolation and power isolation are treated differently and implemented separately in the design.

FIG. 1A illustrates an example block diagram of a power domain 105 and related power isolation circuits including a logic block 110, a test wrapper cell 115, an isolation cell 120, a test control unit 160, and a power control unit 125, in accordance with some embodiments. In this embodiment, the test wrapper cell logic and the power isolation cell logic are controlled separately through a test control unit (TCU) 160 and a power control unit (PMU) 125.

The logic block 110 and the corresponding power domain 105 in a SOC design uses power isolation for low-power modes. A "logic block" as used herein may refer to a core logic block, a hard IP, or other similar block of logic. A power isolation cell 120 is placed along the I/O boundary of the logic block 110 in the I/O paths for low-power operation, such as power ON/OFF of the logic block 110. The test wrapper cell 115 may be coupled to the logic block 110. The isolation cell 120 may be coupled to the test wrapper cell 115. It will be understood that any sufficiently similar kind of test wrapper cell 115 can be used, including one with conventional safe-state cells, or one with a simpler streamlined path in accordance with embodiments described in further detail below. The power control unit 125 may be coupled to the isolation cell 120, and receive a DFT internal core test mode control signal and a clamp control signal, as also further described in detail below, to control the isolation cell 120. The test control unit 160 may be coupled to the test wrapper cell 115, which provides a test function in a test mode.

Figure 1B:
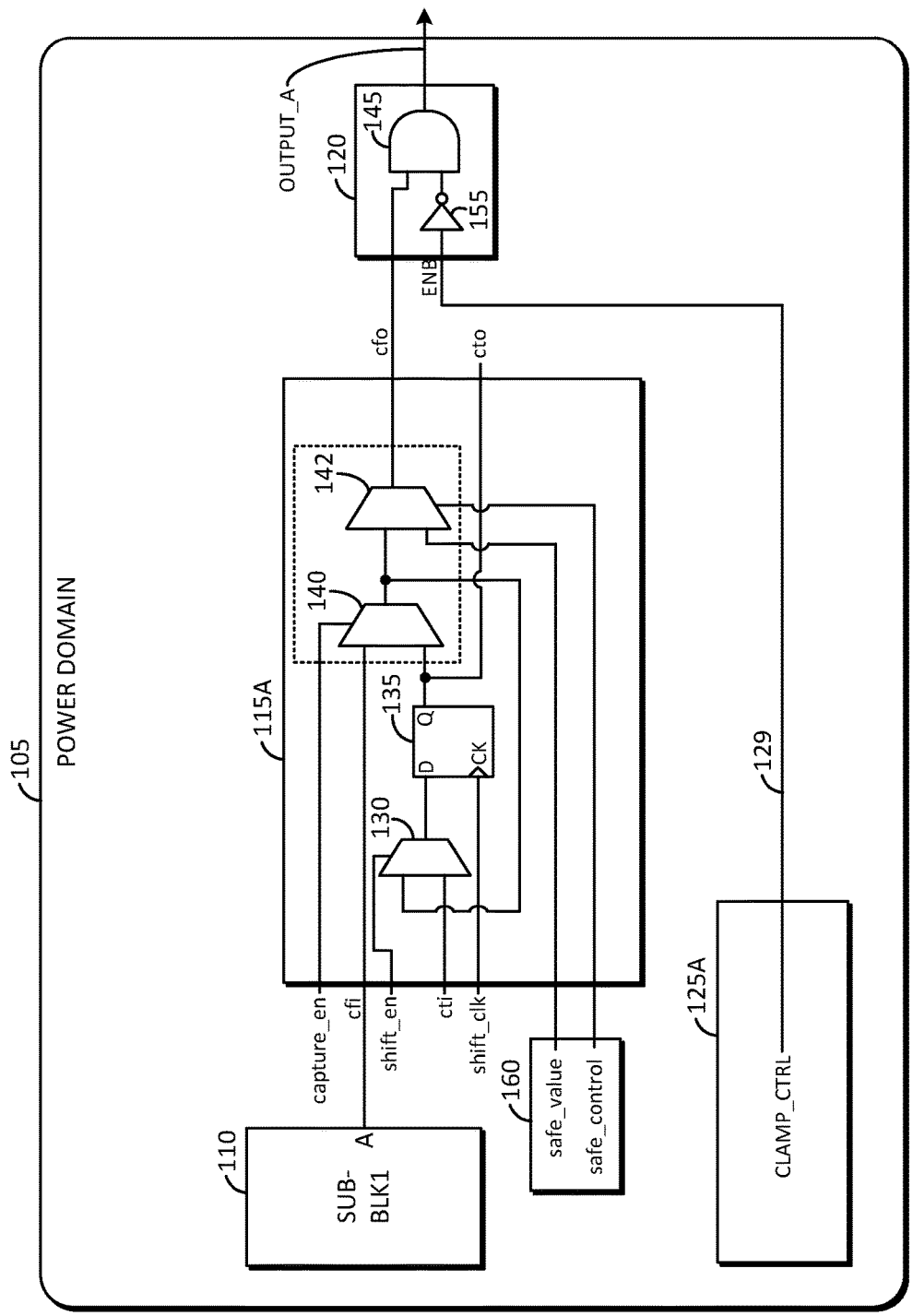
FIG. 1B is an example block diagram of the power domain and related logic components of FIG. 1A, with additional detail in accordance with some embodiments."

FIG. 1B is an example block diagram of the power domain 105 and related logic components of FIG. 1A, with additional detail in accordance with some embodiments. An output (e.g., OUTPUT_A) is associated with the test wrapper cell 115A and the isolation cell 120. It will be understood that the power domain 105 may have multiple outputs each associated with its own test wrapper cell and isolation cell, as further described in detail below.

The logic block 110 in a SOC design is associated with test wrapper cells for core wrapping test modes. The test wrapper cell 115A provides controllability and observability on the functional inputs and outputs of a core IP to improve testability. The test wrapper cell 115A is connected to test wrapper chain(s) usually placed along the I/O boundary of a core between the I/O ports and core logic, as further described below. The test wrapper cell 115A adds a 2-mux delay to the functional path via multiplexors 140 and 142. The test wrapper cell 115A may provide additional control and/or observe logic functionality. An input test wrapper cell provides isolation and control to the input when testing a logic block, while an output wrapper cell (e.g., 115A) at the output port captures and observes the test data coming to the output path. The output isolation during test prevents the core outputs from toggling, which may otherwise cause problems with other blocks and power domains. The switching outputs during test would otherwise increase test power consumption as well, which can cause significant IR drop and additional test failures. Referring to FIG. 1B, the output of the mux 140 in the output wrapper cell 115A may toggle during test. To prevent the toggle propagating to the output port OUTPUT_A, the mux 142 with the safe_value and safe_control are added in the output wrapper cell 115A.

The power control unit 125A may transmit a clamp control signal (e.g., CLAMP_CTRL). The clamp control signal 129 may be transmitted to the isolation cell 120. The clamp control signal 129 may be transmitted to an inverter 155 of the isolation cell 120, which may invert the clamp control signal 129.

The isolation cell 120 may include a logic gate 145, which may receive the clamp control signal 129 from the power control unit 125A. In some embodiments, the logic gate 145 of the isolation cell 120 may be an AND gate. The logic gate 145 may include a first input terminal that is coupled to the test wrapper cell 115A, and a second input terminal that is configured to receive the clamp control signal 129 from the power control unit 125A. The functional path follows cfi-to-cfo, and the scan path follows cti-to-cto, as shown in FIG. 1B.

The test wrapper cell 115A may include a first selector 140, a latch 135 coupled to the first selector 140, and a second selector 130 coupled to the latch 135. The test wrapper cell 115A may further include a third selector 142. In some embodiments, the first selector 140 is a multiplexor, the second selector 130 is a multiplexor, and the third selector 142 is a multiplexor. In some embodiments, the latch 135 is a clocked flip-flop. The multiplexor 140 may include a first input terminal coupled to an output terminal of the logic block 110, over which a functional path signal (e.g., cfi) may be received. The multiplexor 140 may also include a second input terminal coupled to an output terminal of the clocked flip-flop 135. The multiplexor 140 may be controlled by a first control signal (e.g., capture_en). The output terminal of the multiplexor 140 may be coupled to the isolation cell 120.

The multiplexor 130 may include a first input terminal coupled to an output terminal of the multiplexor 140. The multiplexor 130 may include a second input terminal that may receive a scan path signal (e.g., cti). The multiplexor 130 may be controlled by a second control signal (e.g., shift_en). An output terminal of the multiplexor 130 may be coupled to an input terminal of the clocked flip-flop 135. A clock port of the flip-flop 135 may receive a clock signal (e.g., shift_clk). The test control unit 160 may provide safe_value and safe_control signals to control the third multiplexor 142. With the 2-mux cells and the additional power isolation cell in the path, the functional speed and timing may be degraded on the OUTPUT_A port and the downstream logic. These added cells and associated logic may also increase the area overhead and power consumption to the design.

Figure 2A:
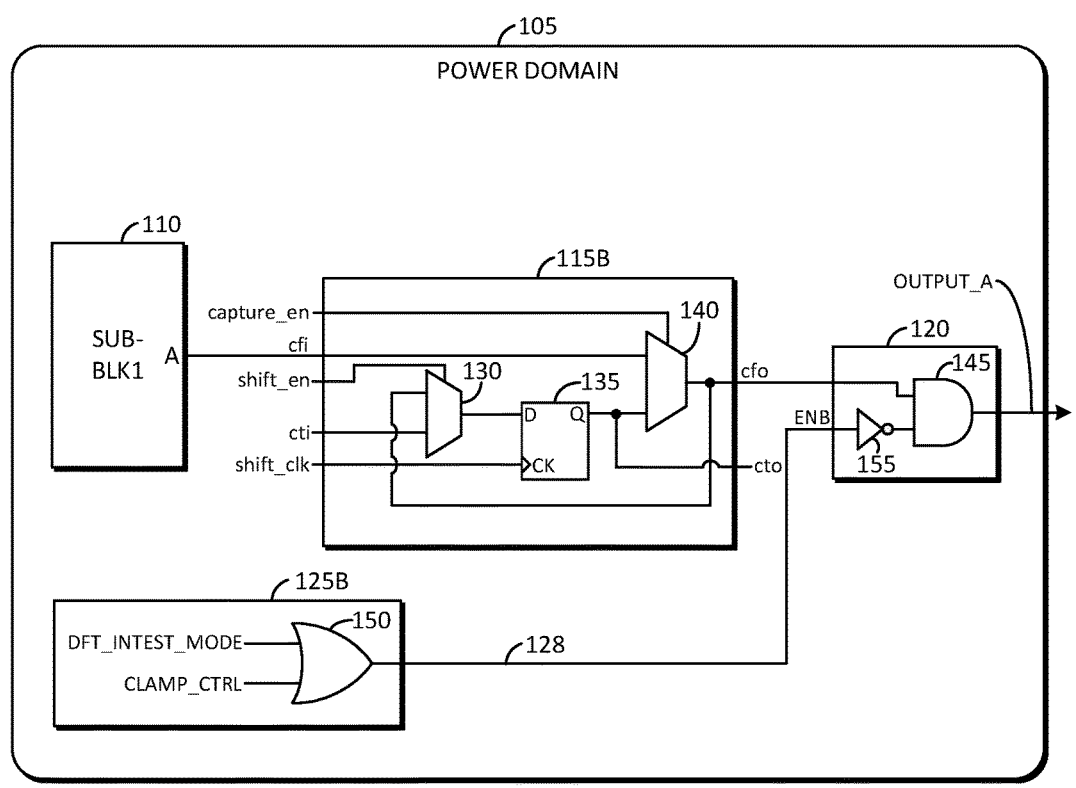
FIG. 2A is an example block diagram of the power domain and related logic components of FIG. 1A, with additional detail in accordance with some embodiments.

FIG. 2A is an example block diagram of the power domain 105 and related logic components of FIG. 1A, with additional detail in accordance with some embodiments. A new control signal 128 is created through the combined signals of the DFT_INTEST_MODE signal (e.g., from the TCU) and the CLAMP_CTRL signal (e.g., from the PMU). In some embodiments, the new control signal can be created through an OR logic function. With this new control to the power isolation cell 120, and the use of a simple test wrapper cell 115B with only 1-mux delay in the functional path, the delay and logic on the OUTPUT_A port is reduced. At the same time, the functionality for both test mode and low-power mode is achieved at least as well as the embodiment shown in FIG. 1B. An output (e.g., OUTPUT_A) is associated with the test wrapper cell 115B and the isolation cell 120. It will be understood that the power domain 105 may have multiple outputs each associated with its own test wrapper cell and isolation cell, as further described in detail below.

The logic block 110 in a SOC design is associated with test wrapper cells for core wrapping test modes. The test wrapper cell 115B provides controllability and observability on the functional inputs and outputs of a core IP to improve testability. The test wrapper cell 115B is connected to test wrapper chain(s) usually placed along the I/O boundary of a core between the I/O ports and core logic, as further described below. The test wrapper cell 115B need not have the safe-state mux 142 as the case shown in FIG. 1B. It only adds a 1-mux delay to the functional path from mux 140. The test wrapper cell 115B may provide additional control and/or observe logic functionality. An input test wrapper cell provides isolation and control to the input when testing a logic block, while an output wrapper cell (e.g., 115B) at the output ports captures and observes the test data coming to the output paths. Referring to FIG. 2A, the output of the output wrapper cell 115B may toggle during test at the output of mux 140, but it can be blocked and still achieve steady state at the output, OUTPUT_A, through test mode control to the isolation cell 120 as further described below. The test wrapper cell 115B has less logic and cells than conventional approaches, and less timing impact with only a 1-mux delay to the functional path.

The power control unit 125B may include a logic gate 150. The logic gate 150 may include a first input terminal to receive a DFT internal core test mode control signal (e.g., DFT_INTEST_MODE). The logic gate 150 may include a second input terminal to receive a clamp control signal (e.g., CLAMP_CTRL). The logic gate 150 may include an output terminal configured to transmit a DFT clamp control signal 128 to the isolation cell 120. In some embodiments, the logic gate 150 is an OR gate. It will be understood that one or more logic gates can collectively replace the OR gate, having the same truth table, without departing from the inventive concepts disclosed herein. The DFT clamp control signal 128 may be transmitted to an inverter 155 of the isolation cell 120, which may invert the DFT clamp control signal 128.

The isolation cell 120 may include a logic gate 145, which may receive the DFT clamp control signal 128 from the power control unit 125B. The power control unit 125B may place the isolation cell 120 into an internal core test mode dependent on the DFT internal core test mode control signal (e.g., DFT_INTEST_MODE). In some embodiments, the logic gate 145 of the isolation cell 120 may be an AND gate. The logic gate 145 may include a first input terminal that is coupled to the test wrapper cell 115B, and a second input terminal that is configured to receive the DFT clamp control signal 128 from the power control unit 125B. The functional path follows cfi-to-cfo, and the scan path follows cti-to-cto, as shown in FIG. 2A.

The test wrapper cell 115B may include a first selector 140, a latch 135 coupled to the first selector 140, and a second selector 130 coupled to the latch 135. In some embodiments, the first selector 140 is a multiplexor, and the second selector 130 is a multiplexor. In some embodiments, the latch 135 is a clocked flip-flop. The multiplexor 140 may include a first input terminal coupled to an output terminal of the logic block 110, over which a functional path signal (e.g., cfi) may be received. The multiplexor 140 may also include a second input terminal coupled to an output terminal of the clocked flip-flop 135. The multiplexor 140 may be controlled by a first control signal (e.g., capture_en). The output terminal of the multiplexor 140 may be coupled to the isolation cell 120.

The multiplexor 130 may include a first input terminal coupled to an output terminal of the multiplexor 140. The multiplexor 130 may include a second input terminal that may receive a scan path signal (e.g., cti). The multiplexor 130 may be controlled by a second control signal (e.g., shift_en). An output terminal of the multiplexor 130 may be coupled to an input terminal of the clocked flip-flop 135. A clock port of the flip-flop 135 may receive a clock signal (e.g., shift_clk).

The output path may only have a 1-mux delay instead of a 2-mux delay. In a core that has multiple I/O wrapper cells (e.g., a few thousand), this translates into corresponding fewer number of multiplexor cells for each I/O wrapper cell. There can be many embedded cores and hard IPs, each with their own respective power domains, and with test wrapper cells inserted on their I/Os for test isolation. Embodiments disclosed herein provide such implementations using less cells and area required to implement the test wrapper logic, and less timing delay on the I/O paths, which is important to critical I/O paths within the core and between cores and other logic blocks in the SOC. Since there are fewer cells used in the I/O functional paths, this results in less power consumption in the functional mode as well.

When the logic block 110 is in INTEST mode, the DFT_INTEST_MODE signal may be set to high, so that the DFT clamp control signal 128 on the ENB port changes to high, then the power isolation cell 120 has a constant clamp value of 0 while the power domain 105 is still on. In this case, the test wrapper cell 115B does not include the second mux 142 as in test wrapper cell 115A for safe state, but instead by utilizing the existing power isolation cell 120 with an added test control, DFT_INTEST_MODE, in the clamp control logic, the steady state is still achieved at the output port, OUTPUT_A, during the INTEST mode. As such, the power isolation cell acts as a test isolation cell or provides test isolation functionality in the core test mode through the use of the added test control to the clamp control.

The INTEST mode can also include a core debug test mode using scan chains in the design. A typical usage scenario is the so-called scan dump or scan divergence debug mode for functional failure debug of a core or the entire IC chip utilizing scan chain infrastructure, usually a single long chain, built in the design. A single scan chain within a core or the entire design is implemented by connecting all scan cells or concatenating all regular scan test chains into one long chain. The scan dump operation involves functional mode and scan debug test mode. To debug functional failures, some functional tests can be run on the IC chip. Once some functional failure has occurred, the registers in the design can have the state values captured at the time, which include error (unexpected) data in some registers. Since all registers are also scan cells stitched in the scan chain, the values of the registers can be shifted out along the scan chain to external memory or storage devices for further processing and analysis. This can, in turn, identify where the error data is coming from and hopefully the root cause of the failure in the chip, which could be a hardware logic design problem or a manufacturing defect. By including the debug test mode signal as part of the DFT_INTEST_MODE signal, test isolation is provided on the functional outputs of the core under debug to prevent corrupting data in other blocks or memory arrays for additional debug and analysis. In some embodiments, the internal core test mode includes a functional debug test mode that uses the scan chain infrastructure for diagnosing a root cause of functional failure, and the power control unit can place the plurality of isolation cells into the functional debug test mode dependent on a functional debug test mode control signal.

It is appreciated that other logic implementations with similar logic output may be used to replace the logic OR gate 150 without deviating from the scope of the present disclosure. Also, only one OR logic gate may be added on the clamp control signal, which can be transmitted to each ENB port of the power isolation cells 120. In some embodiments, the DFT_INTEST_MODE may be received from the test control unit 160 (of FIG. 1A). In some embodiments, the DFT clamp control signal 128 is created through the combined signals of DFT_INTEST_MODE and CLAMP_CTRL from the power control unit 125B. Accordingly, using such control to the power isolation cell and the use of a test wrapper cell having only a 1-mux delay, the delay and logic on the OUTPUT_A port is reduced, and both test mode and low-power mode functionality may be achieved.

Figure 2B:
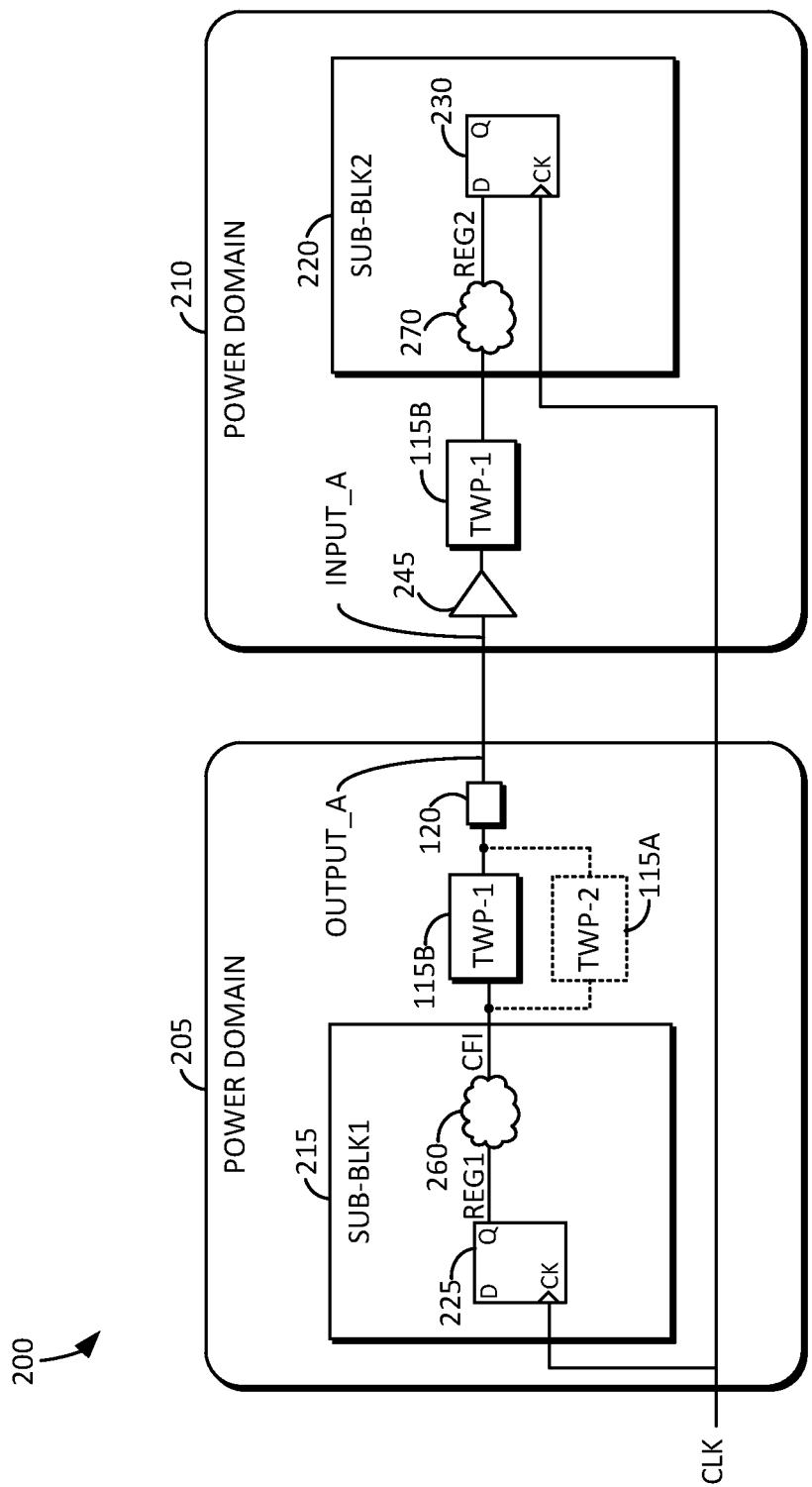
FIG. 2B is an example block diagram of a multi-power domain system including logic components of FIGS. 1A and 2A.

FIG. 2B is an example block diagram of a multi-power domain system 200 including logic components of FIGS. 1A and 2A. The multi-power domain system 200 includes a launch and capture path between two different logic blocks (e.g., 215 and 220) in two separate power domains (e.g., 205 and 210), respectively. Due to the long propagation delays from cells in the data path, the speed and the timing can be degraded, and using conventional technology, can lead to timing failures and inability to meet targeted speed. However, in accordance with the embodiment of FIG. 2B, the data path has only a 1-mux delay using the TWP-1 test wrapper cell 115B instead of a 2-mux delay with TWP-2 test wrapper cell 115A. Accordingly, less timing delay on the IO paths is achieved, which ensures that timing requirements on critical IO paths between cores and other logic blocks in the SOC are met.

As shown in FIG. 2B, there are two logic blocks (e.g., 215 and 220), each in its own power domain (e.g., 205 and 210). Each of the logic blocks (e.g., 215 and 220) has associated therewith test wrapper cells (e.g., 115B), respectively, in a SOC with multiple power domains. The logic block 215 may have one or more power isolation cells (e.g., 120) associated therewith. The logic block 220 may have one or more level-shifter cells 245 associated therewith. The logic blocks (e.g., 215 and 220) may be situated in two different power domains (e.g., 205 and 210), respectively, and may be adjacent to each other in a SOC. There are signals crossing between the logic blocks (e.g., 215 and 220).

The outputs (e.g., OUTPUT_A) may have a TWP-1 test wrapper cell (e.g., 115B) and isolation cell (e.g., 120) along the output path in the power domain 105. The inputs (e.g., INPUT_A) may have a level-shifter cell (e.g., 245) and a TWP-2 test wrapper cell (e.g., 115A) associated therewith. An output terminal of the isolation cell 120 of the power domain 205 may be coupled to an input terminal of the level-shifter cell 245 of the power domain 210.

The multi-power domain system 200 illustrated in FIG. 2B may include a power domain 205 including a logic block 215, one or more TWP-1 test wrapper cells 115B coupled to the logic block 215, and one or more isolation cells 120. The power domain 210 may include the logic block 220, one or more TWP-1 test wrapper cells 115B coupled to the logic block 220, and one or more level-shifter cells 245. Each isolation cell (e.g., 120) may be coupled to a corresponding TWP-1 test wrapper cell (e.g., 115B), and to a corresponding output terminal of the logic block 215. Each level-shifter cell (e.g., 245) may be coupled to a corresponding TWP-1 test wrapper cell (e.g., 115B), and to a corresponding input terminal of the logic block 220. An output terminal of the isolation cell (e.g., 120) may be coupled to an input terminal of the level-shifter cell (e.g., 245).

The logic block 215 of the power domain 205 may include a flip-flop 225, which outputs a REG1 signal. The logic block 215 may include other similar circuit components 260. The TWP-1 test wrapper cell 115B may receive functional signal CFI. The TWP-1 test wrapper cell 115B may output a signal to the isolation cell 120, which may output the OUTPUT_A signal. The path through the TWP-1 test wrapper cell 115B provides a 1-mux delay path as compared to a path through the TWP-2 test wrapper cell 115A, which would cause a 2-mux delay. Thus, the path through the TWP-1 test wrapper cell 115B results in less timing delay on the IO path, which improves the ability to meet timing on critical IO paths between cores and other logic blocks in the SOC. The logic block 220 of the power domain 210 may include a flip-flop 230, which inputs a REG2 signal. The logic block 220 may include other similar circuit components 270.

Figure 2C:
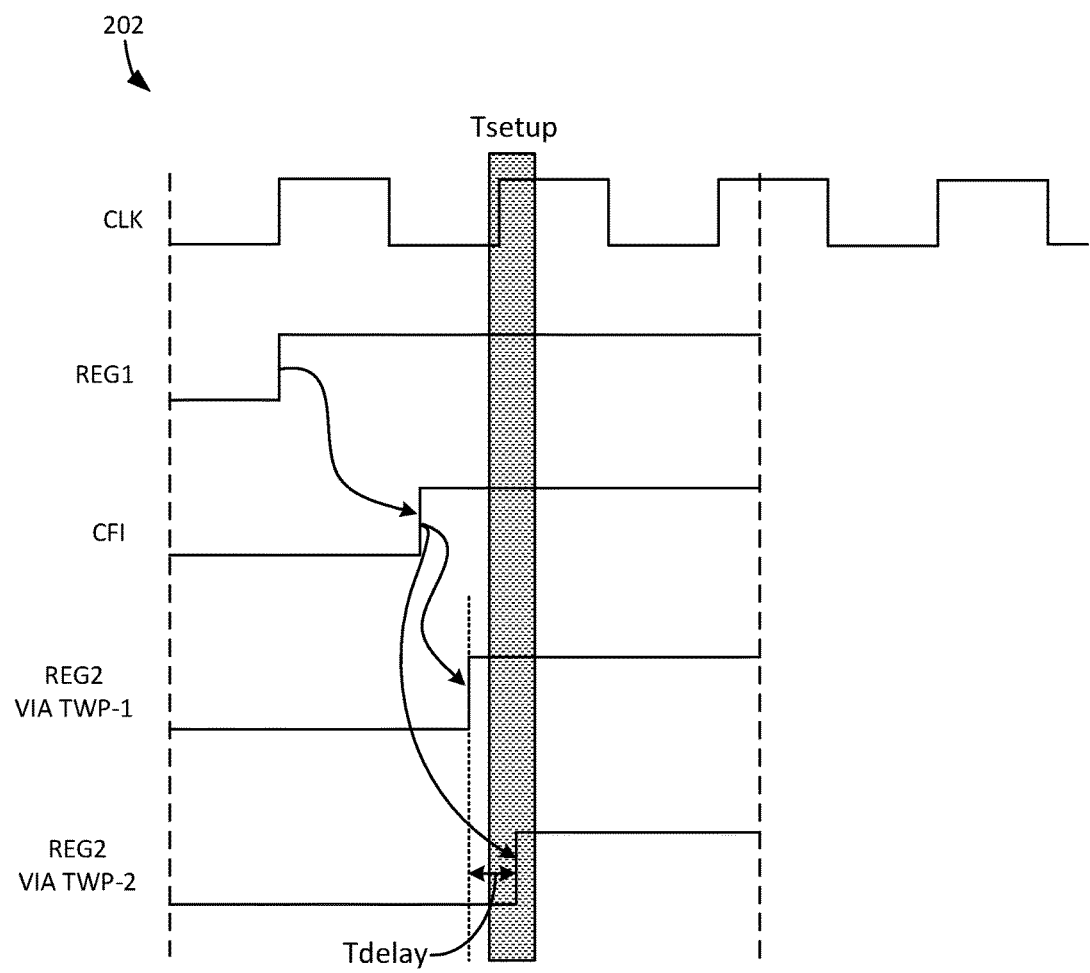
FIG. 2C is an example waveform diagram illustrating various waveforms of signals associated with the multi-power domain system of FIG. 2B.

FIG. 2C is an example waveform diagram 202 illustrating various waveforms of signals associated with the multi-power domain system of FIG. 2B. As explained above, additional mux and IO cell delays may lead to a failure to meet timing due to overall delays on the IO path. Specifically, an additional mux delay Tdelay that would otherwise be caused by a TWP-2 test wrapper cell 115A (of FIG. 2B) can cause late data arrival, thereby leading to a failure to meet a setup timing Tsetup.

The example waveform diagram 202 includes a clock signal CLK, a REG1 signal, a CFI signal, a REG2 signal via TWP-1, and a REG2 signal via TWP-2, all of which correlate to signals shown in the block diagram FIG. 2B. The REG1 signal may be asserted HIGH on a rising edge of the clock signal CLK. The REG1 signal may cause the CFI signal to be asserted HIGH. When the CFI signal propagates through the TWP-1 test wrapper cell 115B of FIG. 2B, the REG2 signal rises sooner relative to the CFI signal propagating through the TWP-2 test wrapper cell 115A of FIG. 2B. The difference between the path through the TWP-1 test wrapper cell 115B and the path through the TWP-2 test wrapper cell 115A is notated as Tdelay. In some situations, the Tdelay can cause a Tsetup time to be violated. Therefore, it is advantageous for the CFI signal to propagate through the TWP-1 test wrapper cell 115B.

Figure 3:
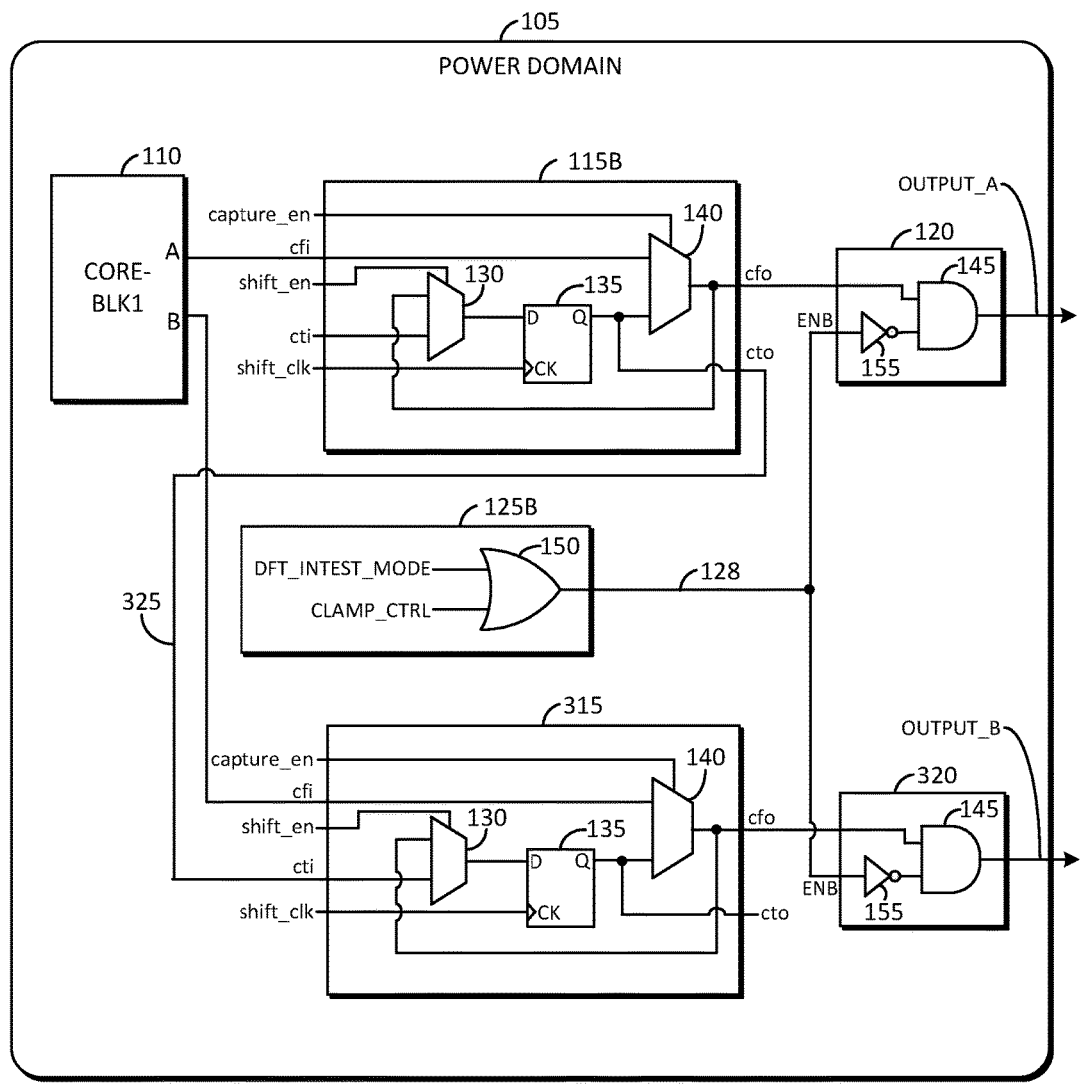
FIG. 3 is an example block diagram of a power domain and related power isolation circuits including a logic block, a plurality of wrapper cells, a plurality of isolation cells, and a power control unit, in accordance with some embodiments.

FIG. 3 is an example block diagram of a power domain and related power isolation circuits including a logic block 110, a plurality of wrapper cells (e.g., 115B and 315), a plurality of isolation cells (e.g., 120 and 320), and a power control unit 125B, in accordance with some embodiments.

The logic block 110 may have two output ports (e.g., A and B), each associated with a separate test wrapper cell (e.g., 115B and 315), and power isolation cell (e.g., 120 and 320). The two wrapper cells (e.g., 115B and 315) may be chained together in a scan path via line 325.

In a multi-power domain core-based design, instead of using conventional safe-state wrapper cells for test modes, the present system allows the functional outputs to be in steady-state (not toggling) while the core is under test. The present system may include two simpler wrapper cells (e.g., 115B and 315) with test-controlled power isolation cells (e.g., 120 and 320). An OR gate 150 of the power control unit 125B may receive a DFT INTEST mode signal (e.g., DFT_INTEST_MODE) and a clamp control signal (e.g., CLAMP_CTRL) to provide an output to the ENB port of both power isolation cells (e.g., 120 and 320). When the logic block 110 is in INTEST mode, the DFT_INTEST_MODE signal may be set to high, so that the DFT clamp control signal 128 on the ENB port changes to high, and both power isolation cells (e.g., 120 and 320) have a clamp value of 0, while the power domain 105 is still on. It will be appreciated that other logic implementations with similar logic output may be used to replace the logic OR gate 150 without deviating from the scope of the present disclosure.

An output terminal of the power control unit 125B may be coupled to the isolation cells (e.g., 120 and 320), and may transmit the DFT clamp control signal 128 to the isolation cells. The output terminal of the clocked flip-flop 135 of the wrapper cell 115B may be coupled to the wrapper cell 315. The wrapper cell 315 may include a multiplexor 140, a clocked flip-flop 135 coupled to the multiplexor 140, and a multiplexor 130 coupled to the clocked flip-flop 135.

The multiplexor 140 of the wrapper cell 315 may include a first input terminal coupled to the output terminal of the logic block 110, and a second input terminal coupled to an output terminal of the clocked flip-flop 135 of the wrapper cell 315. The multiplexor 140 of the wrapper cell 315 may be controlled by the first control signal (e.g., capture_en). The multiplexor 130 of the wrapper cell 315 may include a first input terminal coupled to an output terminal of the multiplexor 140 of the wrapper cell 315, and a second input terminal coupled to the output terminal of the clocked flip flop 135 of the wrapper cell 115B by way of line 325. The input terminal of the multiplexor 130 of the wrapper cell 315 may receive the scan path signal (e.g., cti). The multiplexor 130 of the second wrapper cell 315 may be controlled by the second control signal (e.g., shift_en). An output terminal of the multiplexor 130 of the second wrapper cell 315 may be coupled to an input terminal of the clocked flip-flop 135 of the wrapper cell 315.

Figure 4:
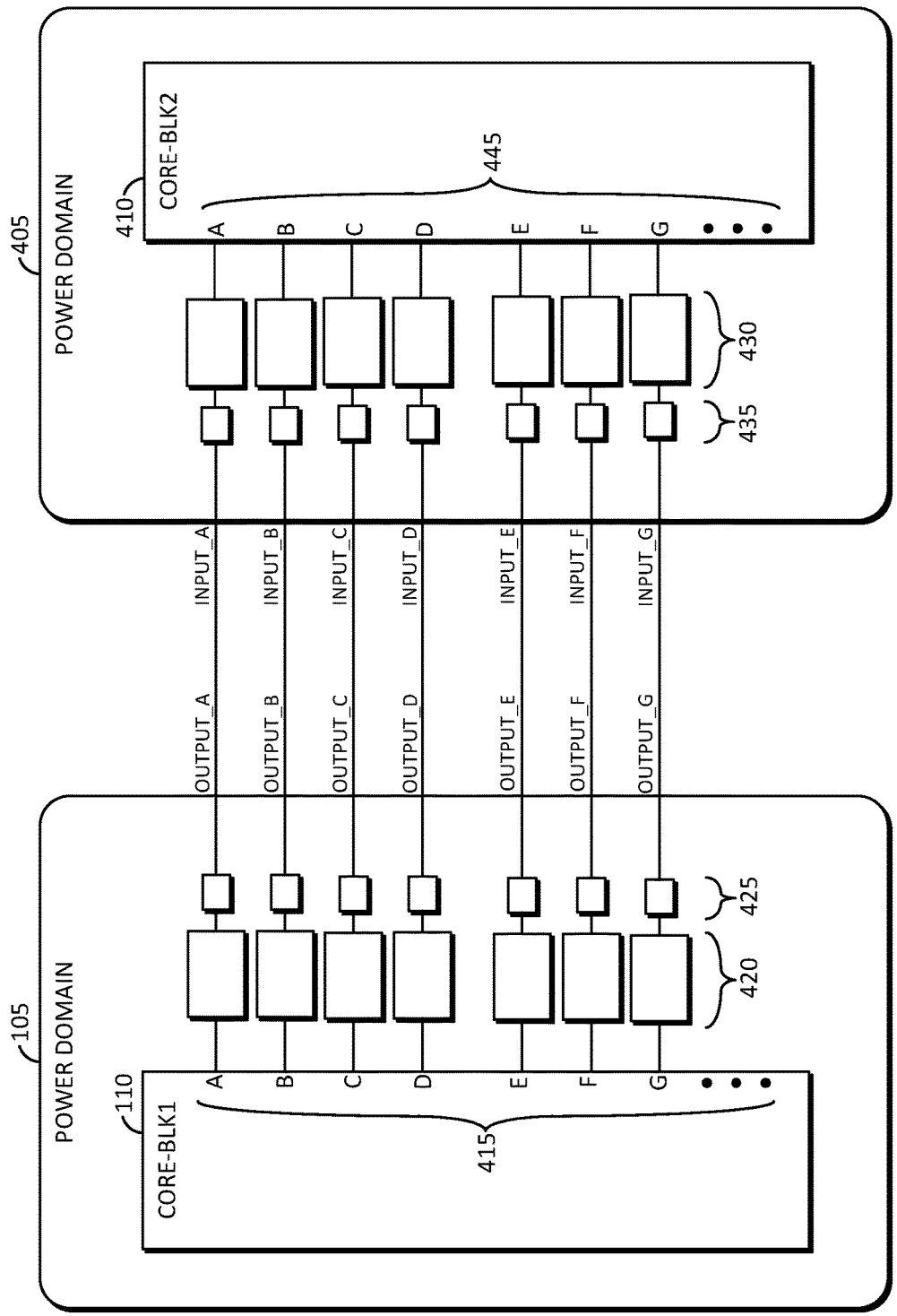
FIG. 4 is an example block diagram of a multi-power domain multi-power isolation system in accordance with some embodiments.

FIG. 4 is an example block diagram of a multi-power domain multi-power isolation system in accordance with some embodiments. As shown in FIG. 4, there are two logic blocks (e.g., 110 and 410), each in its own power domain (e.g., 105 and 405). Each of the logic blocks (e.g., 110 and 410) has associated therewith test wrapper cells (e.g., 420 and 430), respectively, in a SOC with multiple power domains. The logic block 110 may have power isolation cells (e.g., 425) associated therewith. The logic block 410 may have level-shifter cells 435 associated therewith. The logic blocks (e.g., 110 and 410) may be situated in two different power domains (e.g., 105 and 405), and may be adjacent to each other in a SOC. There are signals crossing between the logic blocks (e.g., 110 and 410). The outputs (e.g., OUTPUT_A through OUTPUT_G) may each have a test wrapper cell (e.g., 420) and isolation cell (e.g., 425) in each path in the power domain 105, while the inputs (e.g., INPUT_A through INPUT_G) may each have a level-shifter cell 435 and a test wrapper cell 430 associated therewith. The output terminals of the isolation cells 425 of the power domain 105 may be coupled to input terminals of the level-shifter cells 435 of the power domain 405.

The multi-power domain multi-power isolation system illustrated in FIG. 4 may include a power domain 105 including a logic block 110, wrapper cells 420 coupled to the logic block 110, isolation cells 425, and a power control unit (e.g., 125 of FIG. 1A). The power domain 405 may include a logic block 410, wrapper cells 430 coupled to the logic block 410, and level-shifter cells 435. Each isolation cell 425 may be coupled to a corresponding wrapper cell 420, and to a corresponding output 415 of the logic block 110. Each level-shifter cell 435 may be coupled to a corresponding wrapper cell 430, and to a corresponding input 445 of the logic block 410. An output terminal of each isolation cell 425 may be coupled to an input terminal of each level-shifter cell 435. The power control unit (e.g., 125 of FIG. 1A) may be coupled to the isolation cells 425 in the power domain 105.

The power control unit (e.g., 125 of FIG. 1A) may receive a DFT internal core test mode control signal (e.g., DFT_INTEST_MODE) and a clamp control signal (e.g., CLAMP_CTRL), and control the isolation cells 425 dependent on the DFT internal core test mode control signal (e.g., DFT_INTEST_MODE) and the clamp control signal (e.g., CLAMP_CTRL). The power control unit (e.g., 125 of FIG. 1A) may place the isolation cells 425 into an internal core test mode dependent on the DFT internal core test mode control signal (e.g., 128 of FIG. 3).

Figure 5A:
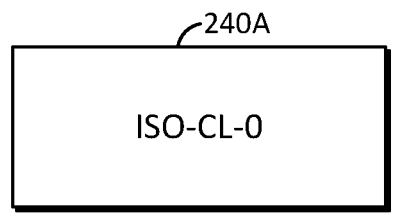
FIG. 5A is an example block diagram of a clamp value-to-zero isolation cell in accordance with some embodiments.
Figure 5B:
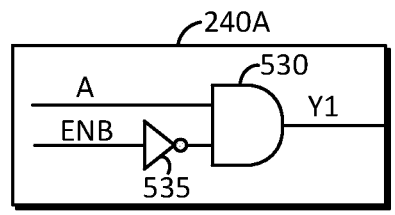
FIG. 5B shows additional details of the clamp value-to-zero isolation cell of FIG. 5A.

FIG. 5A is an example block diagram of a clamp value-to-zero isolation cell ISO-CL-0 240A in accordance with some embodiments. FIG. 5B shows additional details of the clamp value-to-zero isolation cell ISO-CL-0 240A of FIG. 5A. For example, the isolation cell 240A may include a logic gate such as AND gate 530, a first input terminal A, an inverter 535 coupled to a second input terminal, and an output terminal Y1. When ENB=1, the isolation output may be clamped to 0 (e.g., a default value). This type of isolation cell may be applied to output ports having a default state of 0. The isolation cell ISO-CL-0 240A may be the same as the isolation cell 120 of FIG. 2A.

Figure 5C:
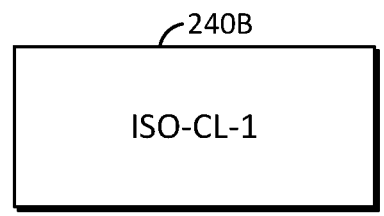
FIG. 5C is an example block diagram of a clamp value-to-one isolation cell in accordance with some embodiments.
Figure 5D:
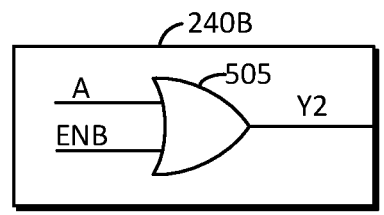
FIG. 5D shows additional details of the clamp value-to-one isolation cell of FIG. 5C.

FIG. 5C is an example block diagram of a clamp value-to-one isolation cell ISO-CL-1 240B in accordance with some embodiments. FIG. 5D shows additional details of the clamp value-to-one isolation cell ISO-CL-1 240B of FIG. 5C. For example, the isolation cell 240B may include a logic gate such as OR gate 505, a first input terminal A, a second input terminal, and an output terminal Y2. When ENB=1, the isolation output may be clamped to 1 (e.g., a default value). This type of isolation cell may be applied to output ports having a default state of 1.

Figure 5E:
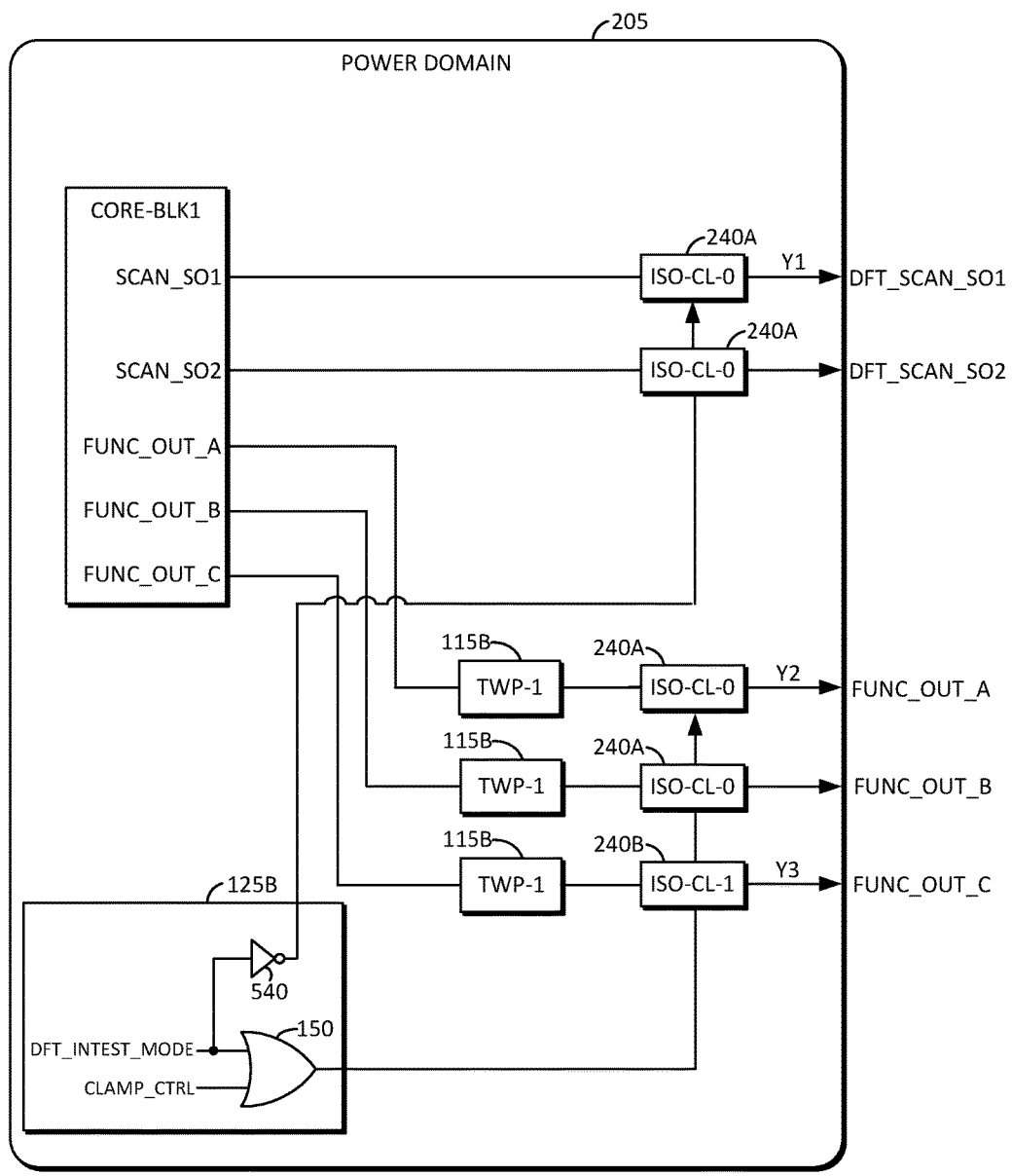
FIG. 5E is an example block diagram of power isolation circuits including various examples of isolation cells, and a power control unit, in accordance with some embodiments.

FIG. 5E is an example block diagram of a power domain 205 including power isolation circuits (e.g., 115B), various examples of isolation cells (e.g., 240A and 240B), and a power control unit 125B, in accordance with some embodiments. In INTEST mode, the power control unit 125B performs a clamp control function with respect to one or more ISO-CL-0 isolation cells 240A and one or more ISO-CL-1 isolation cells 240B. Functional outputs (e.g., FUNC_OUT_A, FUNC_OUT_B, AND FUNC_OUT_C) may be clamped to default values (i.e., not toggling) to prevent switching output from disturbing other logic and blocks in the SOC, and also reducing power consumption during tests. In accordance with embodiments disclosed herein, there is no timing impact to functional IO paths and no cell area increase required.

The power control unit 125B may clamp isolation cells for both test and power isolations. Functional outputs having a default state of 0 (e.g., Y2) may be clamped to LOW. Functional outputs having a default state of 1 (e.g., Y3) may be clamped to HIGH. The power control unit 125B may apply clamp control logic to the isolation cells (e.g., 240A and 240B) dependent on a DFT internal core test mode control signal (e.g., DFT_INTEST_MODE) such that during the INTEST mode, the functional outputs are clamped to default values (i.e., not toggling) to prevent switching outputs disturbing other logic and blocks in the SOC, and also to reduce power consumptions during the test. In addition, the power control unit 125B may apply clamp control logic to one or more ISO-CL-0 isolation cells 240A associated with the scan test outputs (e.g., DFT_SCAN_SO1 and DFT_SCAN_SO2). For example, power control unit 125B may clamp the scan test outputs to LOW during the INTEST mode.

According to some embodiments, test isolation is provided with power isolation circuits having added DFT control going to the enable path ENB of isolation cells (e.g., 240A and 240B) in designs with multiple power domains such as low-power SOCs. The test wrapper cells may include any general and special types of test wrapper cells along with any types of power isolation cells for low-power designs, such as dedicated test wrapper cells, scan and built-in self-test (BIST) test combined wrapper cells, and shared wrapper cells, without deviating from the scope of the present disclosure. The system disclosed herein reduces logic and area overhead, reduces power consumption during test and functional modes of operations, has less timing delay, and has less timing impact on the I/O paths. The system disclosed herein improves physical design effort on I/O boundary and I/O paths, by reducing logic and area needed for the test wrapper and power isolation logic, thereby easing routing and congestion in the I/O boundary area.

In some embodiments, the isolation cell 240A includes a logic gate (e.g., 530 of FIG. 5B). In some embodiments, the logic gate 530 is an AND gate. The logic gate 530 may have a first input terminal and a second input terminal. The isolation cell 240A may further include an inverter 535 coupled to the second input terminal of the AND gate 530. The first input terminal of the AND gate 530 may be coupled to a wrapper cell (e.g., 115B). The second terminal of the AND gate 530 may be coupled to the power control unit 125B, via the inverter 535. The power control unit 125B may include an inverter 540. The inverter 540 may receive and invert the DFT internal core test mode control signal (e.g., DFT_INTEST_MODE). The inverter 535 may receive and invert again the DFT internal core test mode control signal (e.g., DFT_INTEST_MODE), thereby cancelling out the first inversion. In some embodiments, the inverter 540 is coupled to the second input terminal of the AND gate 530, via the inverter 535. The power control unit 125B may include an OR gate 150. In some embodiments, the OR gate 150 of the power control unit 125B is coupled to the second input terminal of the AND gate 530, via the inverter 535.

In some embodiments, the isolation cell 240B may include a logic gate (e.g., 505 of FIG. 5D). In some embodiments, the logic gate 505 is an OR gate. The logic gate 505 may have a first input terminal and a second input terminal. The first input terminal of the OR gate 505 may be coupled to a wrapper cell (e.g., 115B). The second terminal of the OR gate 505 may be coupled to the power control unit 125B. In some embodiments, the OR gate 150 of the power control unit 125B is coupled to the second input terminal of the OR gate 505.

In some embodiments, the outputs Y1 is a design-for-test scan test output, which may be clamped to LOW responsive to the power control unit 125B. In some embodiments, the outputs Y2 and Y3 are functional outputs, which may be clamped to LOW and HIGH, respectively, responsive to the power control unit 125B. The outputs may provide functional and/or design-for-test signals from the pertinent power domain.

Figure 5F:
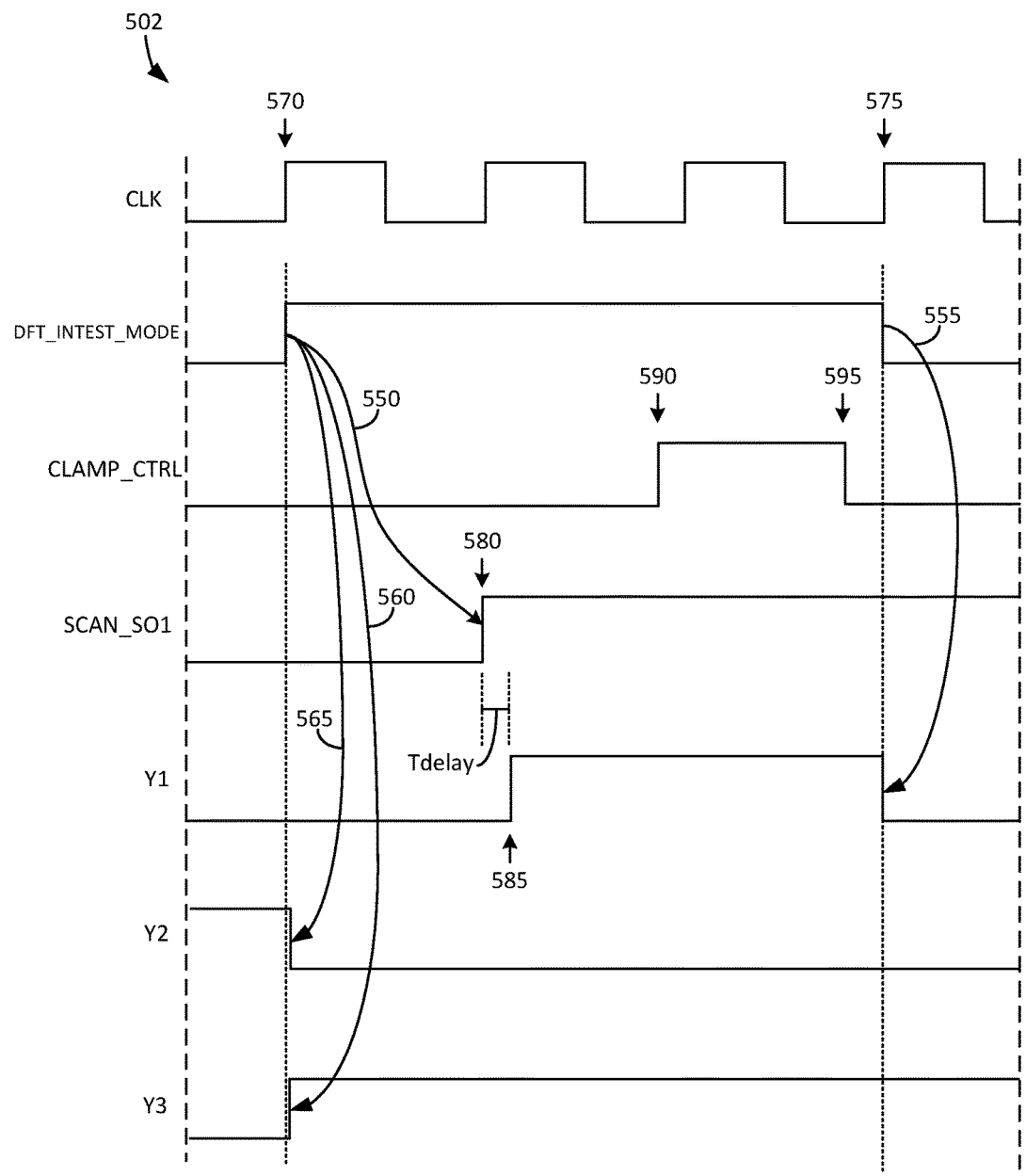
FIG. 5F is an example waveform diagram illustrating various waveforms of signals associated with the logic components of FIG. 5E.

FIG. 5F is an example waveform diagram 502 illustrating various waveforms of signals associated with the logic components of FIG. 5E. In the INTEST mode, functional outputs may be clamped to a steady value (i.e., 0 or 1), and scan outputs enabled. At 550, the DFT_INTEST_MODE signal may be asserted HIGH at the rising edge 570 of the CLK signal. Consequently, the output Y2 may be clamped at 565 to 0 for FUNC_OUT_B with a default state of 0. In addition, the output Y3 may be clamped at 560 to 1 for FUNC_OUT_C with a default state of 1. The SCAN_SO1 may be asserted HIGH at 580. A 1-mux delay (i.e., Tdelay) may occur between 580 and the rising edge 585 of the output Y1 signal. The CLAMP_CTRL signal may be asserted HIGH at 590 and de-asserted LOW at 595. At the rising edge 575 of the CLK signal, the DFT_INTEST_MODE signal may be de-asserted LOW at 555, thereby causing the output Y1 signal to be clamped to 0.

Figure 6:
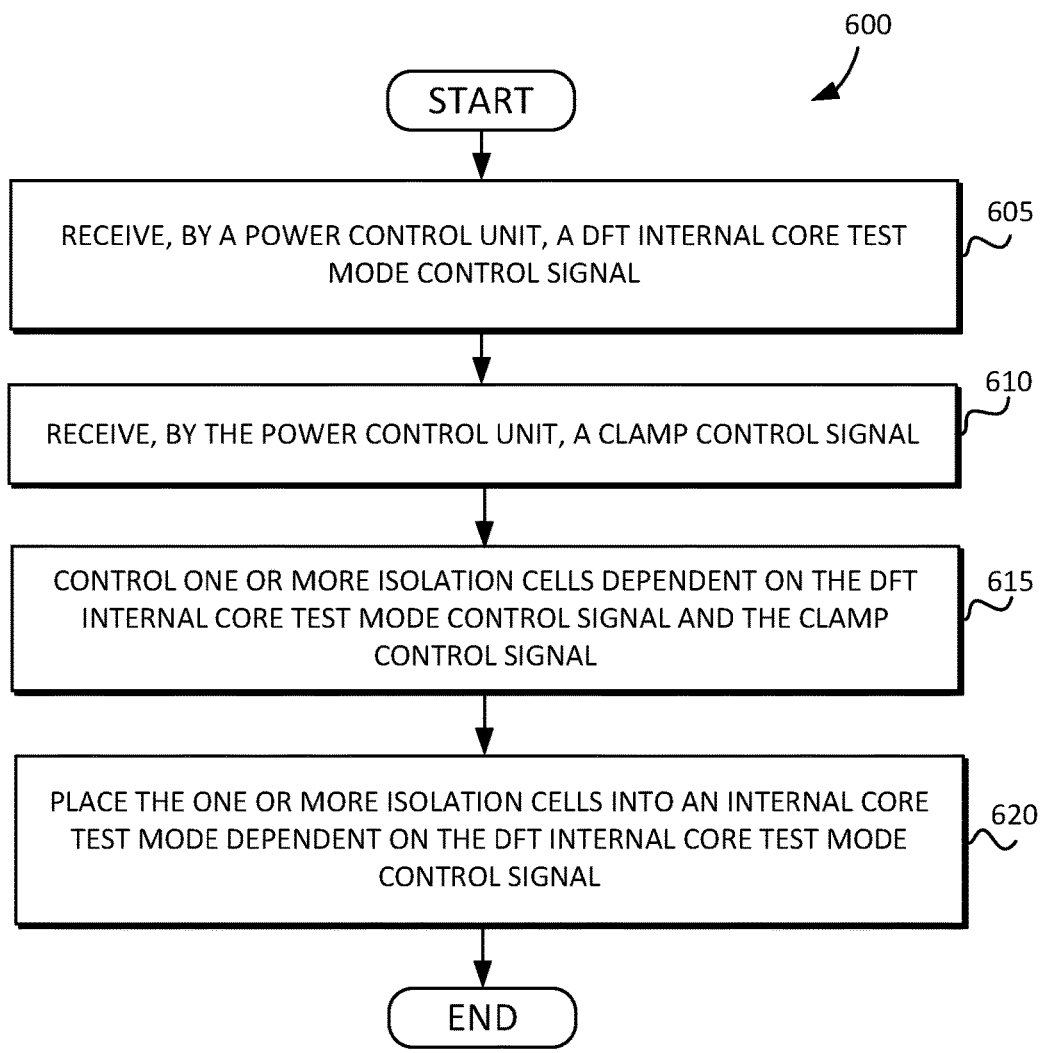
FIG. 6 is a flow diagram illustrating a technique for power isolation of circuits associated with a power domain in accordance with some embodiments.

FIG. 6 is a flow diagram 600 illustrating a technique for power isolation and testing of circuits associated with a power domain in accordance with some embodiments. The flow may begin at 605, where a power control unit receives a DFT internal core test mode control signal. At 610, the power control unit receives a clamp control signal. At 615, the power control unit controls one or more isolation cells dependent on the DFT internal core test mode control signal and the clamp control signal. At 620, the one or more isolation cells is placed into an internal core test mode dependent on the DFT internal core test mode control signal.

Embodiments described herein can be applied to general and special types of test wrapper cells, along with any type of power isolation cells for low-power designs, such as dedicated test wrapper cells, scan and built-in self test (BIST) test combined wrapper cells, and/or shared wrapper cells. The circuits described herein provide optimization at core boundaries for power isolation, which yields reduced power consumption during test and functional modes of operation. Using the techniques described herein, less timing delay and timing impact on the I/O path can be realized. This is especially important to the critical I/O paths. Since the embedded core and hard IPs in a SOC need to have isolation during a test mode, the power control unit provides the controllability to the isolation cells. The test wrapper cells described herein reduce the levels of muxes in the I/O paths, which improves I/O timing and speed. The physical design of an I/O boundary and I/O path is improved. The logic and area needed for the test wrapper cell and power isolation logic is reduced, and therefore, routing and congestion in the I/O boundary area are eased.

A method and system of test mode isolation in embedded core based integrated circuits with multiple power domains is disclosed herein. By using a test wrapper cell and power isolation (clamp) cell with a control method and logic, the test mode isolation is achieved through the power isolation cell. The control signal to the power isolation cells can be created through a combinational logic of test mode signal from a TCU and a clamp control signal from a PMU so that when a core is in test mode, the output ports are clamped to a steady state at the outputs of power isolation cells, for example, when the core test mode is asserted. This method reduces overall IO logic, area, timing delay and power consumption over conventional methods, which use test wrapper cells with safe-state logic for test isolation.

Figure 7:
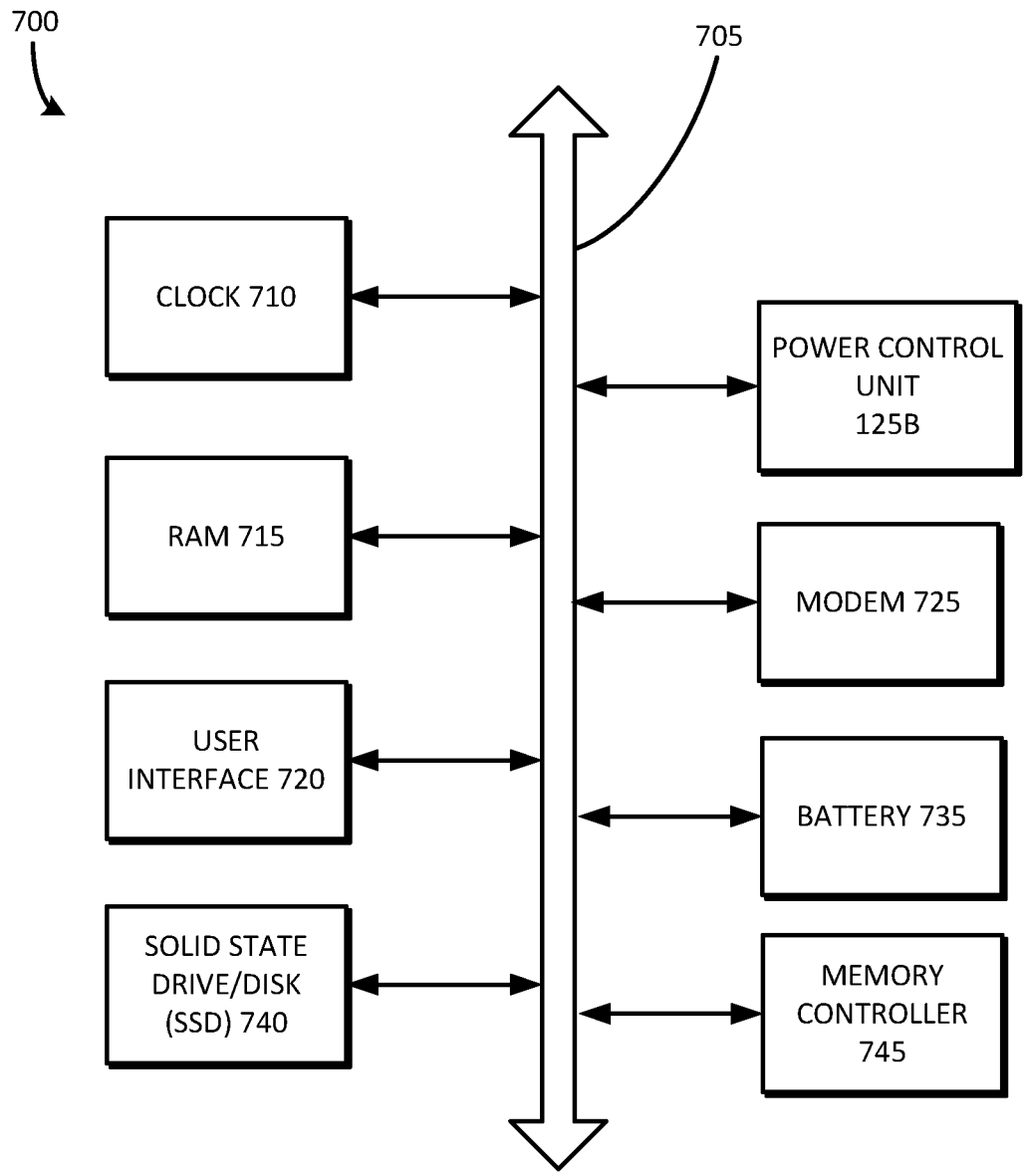
FIG. 7 is a block diagram of a computing system including a power isolation circuit according to embodiments disclosed herein.

FIG. 7 is a block diagram of a computing system 700 including a power control unit 125B according to embodiments disclosed herein. Referring to FIG. 7, the computing system 700 may also include a clock 710, a random access memory (RAM) 715, a user interface 720, a modem 725 such as a baseband chipset, a solid state drive/disk (SSD) 740, a memory controller 745, and/or a battery 735, any or all of which may be electrically coupled to a system bus 705. The power control unit 125B may correspond to those embodiments described in detail above, and may also be electrically coupled to the system bus 705.

If the computing system 700 is a mobile device, the battery 735 may power the computing system 700, and battery drain may be reduced by implementation of the embodiments described herein due more efficient operation. Although not shown in FIG. 7, the computing system 700 may further include an application chipset, a camera image processor (CIS), a mobile DRAM, and the like.

In example embodiments, the computing system 700 may be used as computer, computer server, server rack, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting a telematics network, RFID, or one of various electronic devices constituting a computing system.

Embodiments are described herein, and illustrated in the drawings, in terms of functional blocks, units and/or modules. Those skilled in the art will appreciate that these blocks, units and/or modules can be physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

The following discussion is intended to provide a brief, general description of a suitable machine or machines in which certain aspects of the inventive concept can be implemented. Typically, the machine or machines include a system bus to which is attached processors, memory, e.g., random access memory (RAM), read-only memory (ROM), or other state preserving medium, storage devices, a video interface, and input/output interface ports. The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciate that network communication can utilize various wired and/or wireless short range or long range carriers and protocols, including radio frequency (RF), satellite, microwave, Institute of Electrical and Electronics Engineers (IEEE) 545.11, Bluetooth®, optical, infrared, cable, laser, etc.

Embodiments can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access.

Having described and illustrated the principles of the inventive concept with reference to illustrated embodiments, it will be recognized that the illustrated embodiments can be modified in arrangement and detail without departing from such principles, and can be combined in any desired manner. And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the inventive concept to particular embodiment configurations. As used herein, these terms can reference the same or different embodiments that are combinable into other embodiments.

Embodiments of the invention may include a non-transitory machine-readable medium comprising instructions executable by one or more processors, the instructions comprising instructions to perform the elements of the embodiments as described herein.

Consequently, in view of the wide variety of permutations to the embodiments described herein, this detailed description and accompanying material is intended to be illustrative only, and should not be taken as limiting the scope of the embodiments. What is claimed as the invention, therefore, is all such modifications as may come within the scope and spirit of the following claims and equivalents thereto.

What is claimed is:

1. An apparatus, comprising:
   a logic block;
   a wrapper cell coupled to the logic block;
   an isolation cell coupled to the wrapper cell; and
   a power control unit coupled to the isolation cell and configured to receive a DFT internal core test mode control signal and a clamp control signal, and to control the isolation cell based, at least in part, upon the DFT internal core test mode control signal and the clamp control signal.

2. The apparatus of claim 1, wherein the power control unit is configured to place the isolation cell into an internal core test mode dependent on the DFT internal core test mode control signal.

3. The apparatus of claim 1, wherein the power control unit comprises a logic gate, wherein the logic gate comprises:
   a first input terminal to receive the DFT internal core test mode control signal;
   a second input terminal to receive the clamp control signal; and
   an output terminal configured to transmit a DFT clamp control signal to the isolation cell.

4. The apparatus of claim 3, wherein the logic gate is an OR gate.

5. The apparatus of claim 3, wherein the isolation cell comprises a logic gate configured to receive the DFT clamp control signal from the power control unit.

6. The apparatus of claim 5, wherein the logic gate of the isolation cell is an OR gate comprising a first input terminal that is coupled to the wrapper cell, and a second input terminal that is configured to receive the DFT clamp control signal from the power control unit.

7. The apparatus of claim 6, wherein:
   the logic gate of the isolation cell is an AND gate having a first input terminal and a second input terminal;

the first input terminal of the AND gate is coupled to the wrapper cell;
the isolation cell further comprises an inverter coupled to the second input terminal of the AND gate; and
the inverter is configured to receive and invert the DFT clamp control signal.

8. The apparatus of claim 7, wherein:
the inverter is referred to as a first inverter;
the apparatus further comprises a second isolation cell that comprises a second inverter coupled to the first inverter, and a second logic gate; and
wherein the second inverter is coupled to a first input terminal of the second logic gate.

9. The apparatus of claim 1, wherein the wrapper cell comprises:
a first selector;
a latch coupled to the first selector; and
a second selector coupled to the latch.

10. The apparatus of claim 9, wherein:
the first selector is a first multiplexor;
the second selector is a second multiplexor; and
the latch is a clocked flip-flop.

11. The apparatus of claim 10, wherein:
the first multiplexor comprises a first input terminal coupled to an output terminal of the logic block, and a second input terminal coupled to an output terminal of the clocked flip-flop;
the first multiplexor is controlled by a first control signal;
the second multiplexor comprises a first input terminal coupled to an output terminal of the first multiplexor, and a second input terminal that is configured to receive a scan path signal;
the second multiplexor is controlled by a second control signal; and
an output terminal of the second multiplexor is coupled to an input terminal of the clocked flip-flop.

12. The apparatus of claim 11, wherein the output terminal of the first multiplexor is coupled to the isolation cell.

13. The apparatus of claim 11, wherein:
the isolation cell is referred to as a first isolation cell;
the wrapper cell is referred to as a first wrapper cell;
the apparatus further comprises a second isolation cell and a second wrapper cell;
an output terminal of the power control unit is coupled to the first and second isolation cells, and configured to transmit a DFT clamp control signal to the first and second isolation cells; and
the output terminal of the clocked flip-flop of the first wrapper cell is coupled to the second wrapper cell.

14. The apparatus of claim 13, wherein the second wrapper cell comprises:
a first multiplexor;
a clocked flip-flop coupled to the first multiplexor; and
a second multiplexor coupled to the clocked flip-flop.

15. The apparatus of claim 14, wherein:
the first multiplexor of the second wrapper cell comprises a first input terminal coupled to the output terminal of the logic block, and a second input terminal coupled to an output terminal of the clocked flip-flop of the second wrapper cell;
the first multiplexor of the second wrapper cell is controlled by the first control signal;
the second multiplexor of the second wrapper cell comprises a first input terminal coupled to an output terminal of the first multiplexor of the second wrapper cell, and a second input terminal coupled to the output terminal of the clocked flip flop of the first wrapper cell;
the second input terminal of the second multiplexor of the second wrapper cell is configured to receive the scan path signal;
the second multiplexor of the second wrapper cell is controlled by the second control signal; and
an output terminal of the second multiplexor of the second wrapper cell is coupled to an input terminal of the clocked flip-flop of the second wrapper cell.

16. The apparatus of claim 1, further comprising a first power domain including the logic block, the wrapper cell, the isolation cell, and the power control unit, wherein an output terminal of the isolation cell is coupled to an input terminal of a level shifter circuit of a second power domain.

17. A multi-power domain multi-power isolation system, comprising:
a first power domain comprising a first logic block, a first plurality of wrapper cells coupled to the first logic block, a plurality of isolation cells, and a power control unit; and
a second power domain comprising a second logic block, a second plurality of wrapper cells coupled to the second logic block, and a plurality of level-shifter cells, wherein:
each isolation cell from among the plurality of isolation cells is coupled to a corresponding wrapper cell from among the first plurality of wrapper cells;
each level-shifter cell from among the plurality of level-shifter cells is coupled to a corresponding wrapper cell from among the second plurality of wrapper cells;
an output terminal of each isolation cell from among the plurality of isolation cells is coupled to an input terminal of each level-shifter cell from among the plurality of level-shifter cells; and
the power control unit is coupled to the plurality of isolation cells in the first power domain.

18. The multi-power domain multi-power isolation system of claim 17, wherein the power control unit is configured to receive a DFT internal core test mode control signal and a clamp control signal, and to control the plurality of isolation cells dependent on the DFT internal core test mode control signal and the clamp control signal.

19. The multi-power domain multi-power isolation system of claim 18, wherein the power control unit is configured to place the plurality of isolation cells into an internal core test mode dependent on the DFT internal core test mode control signal.

20. The multi-power domain multi-power isolation system of claim 19, wherein the internal core test mode includes a functional debug test mode that uses scan chain infrastructure for diagnosing a root cause of functional failure, and wherein the power control unit is configured to place the plurality of isolation cells into the functional debug test mode dependent on a functional debug test mode control signal.

* * * * *